United States Patent
Schediwy

(10) Patent No.: US 10,534,473 B2
(45) Date of Patent: Jan. 14, 2020

(54) FORCE SENSING RESISTOR (FSR) WITH CAPACITIVE SENSING

(71) Applicant: Synaptics Incorporated, San Jose, CA (US)

(72) Inventor: Richard Schediwy, Union City, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 78 days.

(21) Appl. No.: 15/815,519

(22) Filed: Nov. 16, 2017

(65) Prior Publication Data

US 2019/0146627 A1    May 16, 2019

(51) Int. Cl.
*G06F 3/041* (2006.01)
*G06F 3/044* (2006.01)
*G06F 3/045* (2006.01)

(52) U.S. Cl.
CPC ............ *G06F 3/0416* (2013.01); *G06F 3/044* (2013.01); *G06F 3/045* (2013.01); *G06F 2203/04101* (2013.01); *G06F 2203/04106* (2013.01)

(58) Field of Classification Search
None
See application file for complete search history.

(56) References Cited

U.S. PATENT DOCUMENTS

2016/0282999 A1*    9/2016    Hwang ................... G06F 3/044

OTHER PUBLICATIONS

Force-sensitive Resistor (FSR), Sensors Actuators Interfaces Communication Tutorials References, SensorWiki.org, http://www.sensorwiki.org/doku.php/sensors/force-sensitive_resistor, pp. 1-4, (2011).

* cited by examiner

*Primary Examiner* — Brian M Butcher
(74) *Attorney, Agent, or Firm* — Paradice & Li LLP

(57) ABSTRACT

An input device includes a sensor apparatus coupled to a sensing region. The sensor apparatus is operable in at least a first mode or a second mode. When operating in the first mode, the input device is configured to detect a capacitance of the sensor apparatus. When operating in a second mode, the input device is configured to detect a resistance of the sensor apparatus. The input device is further configured to process user inputs in the sensing region based at least in part on the detected capacitance or resistance of the sensor apparatus. In some implementations, the input device may be configured to switch between the first mode and the second mode based at least in part on the detected capacitance or resistance of the sensor apparatus.

16 Claims, 7 Drawing Sheets

FORCE SENSING RESISTOR (FSR) WITH CAPACITIVE SENSING

TECHNICAL FIELD

The present embodiments relate generally to force sensing and capacitive sensing.

BACKGROUND OF RELATED ART

Input devices including proximity sensor devices (also commonly referred to as touchpads or touch sensor devices) are widely used in a variety of electronic systems. A proximity sensor device typically includes a sensing region, often demarked by an input surface, in which the proximity sensor device determines the presence, location, and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

Some input devices also have the ability to detect forces applied to an input surface. For example, one or more force sensors positioned beneath the input surface may detect the amount of force exerted on the input surface based, at least in part, on a movement or deflection of the input surface under the applied force. A force sensing resistor (FSR) is a specific type of force sensor that acts as variable resistor when a force or pressure is exerted on the sensors. For example, the resistance of the FSR may be inversely related to the amount of pressure exerted, such that the resistance of the FSR may decrease as greater pressure is exerted on the FSR. Thus, the input device may measure the resistance of the FSR to determine the amount of force applied on the input surface.

In its quiescent state (e.g., when no force or pressure is applied), an FSR acts as an open circuit. The FSR functions as a resistor only after a threshold amount of pressure is applied to the input surface (e.g., causing an active area of the FSR to come into contact with a resistive substrate). Thus, light taps and/or touches on the input surface may not trigger a change in the resistance of the FSR. However, it may be desirable nonetheless to detect such light taps and/or touches as user inputs.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A method of operating a force sensing resistor (FSR) for capacitive sensing is disclosed. The method is performed by an input device including a sensor apparatus coupled to a sensing region and processing circuitry that is operable in at least a first mode or a second mode. When operating in the first mode, the processing circuitry is configured to detect a capacitance of the sensor apparatus. When operating in a second mode, the processing circuitry is configured to detect a resistance of the sensor apparatus. The processing circuitry is further configured to process user inputs in the sensing region based at least in part on the capacitance or the resistance of the sensor apparatus.

In some implementations, the processing circuitry may be configured to operate the sensor apparatus in the first mode when no external forces are exerted in the sensing region, and may be configured to operate the sensor apparatus in the second mode when at least a threshold amount of force is applied to the sensing region. For example, the processing circuitry may be configured to switch between the first mode and the second mode based at least in part on the detected capacitance or resistance of the sensor apparatus. In some aspects, the processing circuitry may switch from the first mode to the second mode when the capacitance of the sensor apparatus exceeds a threshold capacitance. In other aspects, the processing circuitry may switch from the second mode to the first mode when the resistance of the sensor apparatus exceeds a threshold resistance. In other implementations, the processing circuitry may be configured to switch between the first mode and the second mode periodically.

In some implementations the sensor apparatus may comprise a force sensing resistor (FSR). For example, the sensor apparatus may include an active layer and a resistive layer. The active layer may include a first conductive element and a second conductive element. The resistive layer may be formed from a conductive substrate. An air gap may separate the active layer from the resistive layer when no external forces are exerted on the sensor apparatus.

In some implementations, the processing circuitry may be configured to detect the capacitance of the sensor apparatus by transmitting a first signal via the first conductive element and receiving a resulting signal, based on the first signal, via the second conductive element. The processing circuitry may measure a capacitance between the first conductive element and the second conductive element based at least in part on the resulting signal. In some aspects, the processing circuitry may further correlate the measured capacitance with a presence of an input object in a proximity of the sensing region.

In some implementations, the processing circuitry may be configured to detect the resistance of the sensor apparatus by coupling the first conductive element to a first voltage source and coupling the second conductive element to a resistor, such that a first end of the resistor is coupled to the second conductive element and a second end of the resistor is coupled to a second voltage source. For example, the second voltage source may correspond to a ground potential. The processing circuitry may measure a resistance between the first conductive element and the second conductive element based at least in part on a voltage across the resistor. In some aspects, the processing circuitry may be configured to couple the second end of the resistor to a floating voltage when operating the sensor apparatus in the first mode.

BRIEF DESCRIPTION OF THE DRAWINGS

The present embodiments are illustrated by way of example and are not intended to be limited by the figures of the accompanying drawings.

DETAILED DESCRIPTION

Figure 1:
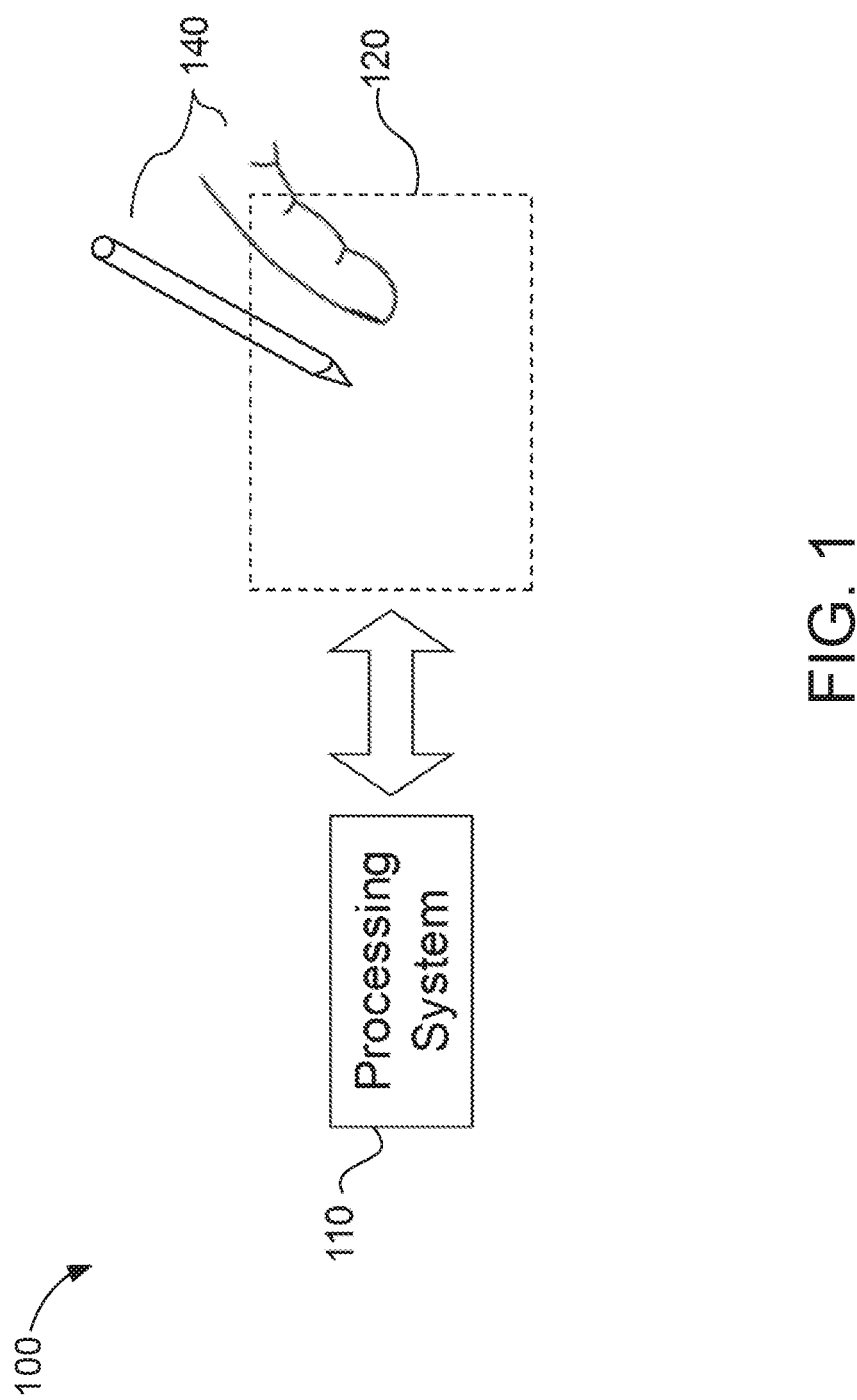
FIG. 1 shows an example input device within which the present embodiments may be implemented.

In the following description, numerous specific details are set forth such as examples of specific components, circuits, and processes to provide a thorough understanding of the present disclosure. The term "coupled" as used herein means connected directly to or connected through one or more intervening components or circuits. The terms "electronic system" and "electronic device" may be used interchangeably to refer to any system capable of electronically processing information. Also, in the following description and for purposes of explanation, specific nomenclature is set forth to provide a thorough understanding of the aspects of the disclosure. However, it will be apparent to one skilled in the art that these specific details may not be required to practice the example embodiments. In other instances, well-known circuits and devices are shown in block diagram form to avoid obscuring the present disclosure. Some portions of the detailed descriptions which follow are presented in terms of procedures, logic blocks, processing and other symbolic representations of operations on data bits within a computer memory.

These descriptions and representations are the means used by those skilled in the data processing arts to most effectively convey the substance of their work to others skilled in the art. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It should be borne in mind, however, that all of these and similar terms are to be associated with the appropriate physical quantities and are merely convenient labels applied to these quantities.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. Also, the example input devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors. The term "processor," as used herein may refer to any general purpose processor, conventional processor, controller, microcontroller, and/or state machine capable of executing scripts or instructions of one or more software programs stored in memory. The term "voltage source," as used herein may refer to a direct-current (DC) voltage source, an alternating-current (AC) voltage source, or any other means of creating an electrical potential (such as ground).

FIG. 1 shows an example input device 100 within which the present embodiments may be implemented. The input device 100 includes a processing system 110 and a sensing region 120. The input device 100 may be configured to provide input to an electronic system (not shown for simplicity). Examples of electronic systems may include personal computing devices (e.g., desktop computers, laptop computers, netbook computers, tablets, web browsers, e-book readers, and personal digital assistants (PDAs)), composite input devices (e.g., physical keyboards, joysticks, and key switches), data input devices (e.g., remote controls and mice), data output devices (e.g., display screens and printers), remote terminals, kiosks, video game machines (e.g., video game consoles, portable gaming devices, and the like), communication devices (e.g., cellular phones such as smart phones), and media devices (e.g., recorders, editors, and players such as televisions, set-top boxes, music players, digital photo frames, and digital cameras).

In some aspects, the input device 100 may be implemented as a physical part of the corresponding electronic system. Alternatively, the input device 100 may be physically separated from the electronic system. The input device 100 may be coupled to (and communicate with) components of the electronic system using various wired and/or wireless interconnection and communication technologies, such as buses and networks. Examples technologies may include Inter-Integrated Circuit ($I^2C$), Serial Peripheral Interface (SPI), PS/2, Universal Serial bus (USB), Bluetooth®, Infrared Data Association (IrDA), and various radio frequency (RF) communication protocols defined by the IEEE 802.11 standard.

In the example of FIG. 1, the input device 100 may correspond to a proximity sensor device (e.g., also referred to as a "touchpad" or "touch sensor device") configured to sense input provided by one or more input objects 140 in the sensing region 120. Example input objects 140 include fingers, styli, and the like. The sensing region 120 may encompass any space above, around, in, and/or proximate to the input device 100 in which the input device 100 is able to detect user input (such as provided by one or more input objects 140). The size, shape, and/or location of the sensing region 120 (e.g., relative to the electronic system) may vary depending on actual implementations.

In some embodiments, the sensing region 120 may extend from a surface of the input device 100 in one or more directions in space, for example, until a signal-to-noise ratio (SNR) of the sensors falls below a threshold suitable for object detection. For example, the distance to which the sensing region 120 extends in a particular direction may be on the order of less than a millimeter, millimeters, centimeters, or more, and may vary with the type of sensing technology used and/or accuracy desired. In some embodiments, the sensing region 120 may detect inputs involving no physical contact with any surfaces of the input device 100, contact with an input surface (e.g., a touch surface and/or screen) of the input device 100, contact with an input surface of the input device 100 coupled with some amount of applied force or pressure, and/or any combination thereof.

In some embodiments, input surfaces may be provided by, and/or projected on, one or more surfaces of a housing of the input device 100 (e.g., as an image). For example, the sensing region 120 may have a rectangular shape when projected onto an input surface of the input device 100. In some aspects, inputs may be provided through images spanning one, two, three, or higher dimensional spaces in the sensing region 120. In some other aspects, inputs may be provided through projections along particular axes or planes in the sensing region 120. Still further, in some aspects, inputs may be provided through a combination of images and projections in the sensing region 120.

The input device 100 may utilize various sensing technologies to detect user input. Example sensing technologies may include capacitive, elastic, resistive, inductive, magnetic, acoustic, ultrasonic, and optical sensing technologies. In some embodiments, the input device 100 may utilize capacitive sensing technologies to detect user inputs. For example, the sensing region 120 may include one or more capacitive sensing elements (e.g., sensor electrodes) to create an electric field. The input device 100 may detect inputs based on changes in capacitance of the sensor electrodes. For example, an object in contact with (or close proximity to) the electric field may cause changes in the voltage and/or current in the sensor electrodes. Such changes in voltage and/or current may be detected as "signals" indicative of user input. The sensor electrodes may be arranged in arrays or other configurations to detect inputs at multiple points within the sensing region 120. In some aspects, some sensor electrodes may be ohmically shorted together to form larger sensor electrodes. Some capacitive sensing technologies may utilize resistive sheets that provide a uniform layer of resistance.

Example capacitive sensing technologies may be based on "self-capacitance" (also referred to as "absolute capacitance") and/or "mutual capacitance" (also referred to as "transcapacitance"). Absolute capacitance sensing methods detect changes in the capacitive coupling between sensor electrodes and an input object. For example, an input object near the sensor electrodes may alter the electric field near the sensor electrodes, thus changing the measured capacitive coupling. In some embodiments, the input device 100 may implement absolute capacitance sensing by modulating sensor electrodes with respect to a reference voltage and detecting the capacitive coupling between the sensor electrodes and input objects. The reference voltage may be substantially constant or may vary. In some aspects, the reference voltage may correspond to a ground potential.

Transcapacitance sensing methods detect changes in the capacitive coupling between sensor electrodes. For example, an input object near the sensor electrodes may alter the electric field between the sensor electrodes, thus changing the measured capacitive coupling of the sensor electrodes. In some embodiments, the input device 100 may implement transcapacitance sensing by detecting the capacitive coupling between one or more "transmitter" sensor electrodes and one or more "receiver" sensor electrodes. Transmitter sensor electrodes may be modulated relative to the receiver sensor electrodes. For example, the transmitter sensor electrodes may be modulated relative to a reference voltage to transmit signals, while the receiver sensor electrodes may be held at a relatively constant voltage to "receive" the transmitted signals. The signals received by the receiver sensor electrodes may be affected by environmental interference (e.g., from other electromagnetic signals and/or objects in contact with, or in close proximity to, the sensor electrodes). In some aspects, each sensor electrode may either be a dedicated transmitter or a dedicated receiver. In other aspects, each sensor electrode may be configured to transmit and receive.

In some embodiments, the input device 100 may further detect a force exerted on an input surface coinciding with the sensing region 120. For example, the input device 100 may include one or more force sensors configured to generate force information representative of the force exerted by the input object 140 when making contact with the sensing region 120. In some aspects, the force information may be in the form of electrical signals representative of an amplitude (or change in amplitude) of the force applied to the input surface. For example, the force sensors may be formed, at least in part, by conductors provided on an underside of the input surface and a resistive substrate underlying the conductors. The conductors may be separated from the resistive substrate by an air gap when little or no external forces are exerted on the input surface. More specifically, the conductors may be brought into contact with the resistive substrate when a force is applied (e.g., by the input object 140) to the input surface. The force sensors may produce electrical signals based on changes in resistance, between the conductors, when the conductors make contact with the resistive substrate.

The processing system 110 may be configured to operate the hardware of the input device 100 to detect input in the sensing region 120. In some embodiments, the processing system 110 may control one or more sensor electrodes and/or force sensors to detect objects in the sensing region 120. For example, the processing system 110 may be configured to transmit signals via one or more transmitter sensor electrodes and receive signals via one or more receiver sensor electrodes. The processing system 110 may also be configured to receive force information via one or more force sensors. In some aspects, one or more components of the processing system 110 may be co-located, for example, in close proximity to the sensing elements of the input device 100. In other aspects, one or more components of the processing system 110 may be physically separated from the sensing elements of the input device 100. For example, the input device 100 may be a peripheral coupled to a computing device, and the processing system 100 may be implemented as software executed by a central processing unit (CPU) of the computing device. In another example, the input device 100 may be physically integrated in a mobile device, and the processing system 110 may correspond, at least in part, to a CPU of the mobile device.

In some embodiments, the processing system 110 may be implemented as a set of modules that are implemented in firmware, software, or a combination thereof. Example modules include hardware operation modules for operating hardware such as sensor electrodes and display screens; data processing modules for processing data such as sensor signals and positional information; and reporting modules for reporting information. In some embodiments, the processing system 110 may include sensor operation modules configured to operate sensing elements to detect user input in the sensing region 120; identification modules configured to identify gestures such as mode changing gestures; and mode changing modules for changing operation modes of the input device 100 and/or electronic system.

The processing system 110 may respond to user input in the sensing region 120 by triggering one or more actions. Example actions include changing an operation mode of the input device 110 and/or graphical user interface (GUI) actions such as cursor movement, selection, menu navigation, and the like. In some embodiments, the processing system 110 may provide information about the detected input to the electronic system (e.g., to a CPU of the electronic system). The electronic system may then process information received from the processing system 110 to carry out additional actions (e.g., changing a mode of the electronic system and/or GUI actions).

The processing system 110 may operate the sensing elements of the input device 100 to produce electrical signals indicative of input (or lack of input) in the sensing region 120. The processing system 110 may perform any appropriate amount of processing on the electrical signals to translate or generate the information provided to the electronic system. For example, the processing system 110 may digitize analog signals received via the sensor electrodes and/or perform filtering or conditioning on the received signals. In some aspects, the processing system 110 may subtract or otherwise account for a "baseline" associated with the sensor electrodes. For example, the baseline may represent a state of the sensor electrodes when no user input is detected. Accordingly, the information provided by the processing system 110 to the electronic system may reflect a difference between the signals received from the sensor electrodes and a baseline associated with each sensor electrode.

In some embodiments, the processing system 110 may further determine positional information and/or force information for a detected input. The term "positional information," as used herein, refers to any information describing or otherwise indicating a position or location of the detected input (e.g., within the sensing region 120). Example positional information may include absolute position, relative position, velocity, acceleration, and/or other types of spatial information. Likewise, the term "force information," as used herein, refers to any information describing or otherwise indicating a force exerted by an input object in contact with a touch surface of the input device 100. For example, the force information may be provided as a vector or scalar quantity (e.g., indicating a direction and/or amplitude). As another example, the force information may include a time history component and/or describe whether the force exerted by the input object exceeds a threshold amount.

In some embodiments, the input device 100 may include a touch screen interface (e.g., display screen) that at least partially overlaps the sensing region 120. For example, the sensor electrodes of the input device 100 may form a substantially transparent overlay on the display screen, thereby providing a touch screen interface for the associated electronic system. The display screen may be any type of dynamic display capable of displaying a visual interface to a user. Examples of suitable display screen technologies may include light emitting diode (LED), organic LED (OLED), cathode ray tube (CRT), liquid crystal display (LCD), plasma, electroluminescence (EL), or other display technology.

In some embodiments, the input device 100 may share physical elements with the display screen. For example, one or more of the sensor electrodes may be used in displaying the interface and sensing inputs. More specifically, a sensor electrode used for sensing inputs may also operate as a display electrode used for displaying at least a portion of the interface. In some embodiments, the input device 100 may include a first sensor electrode configured for displaying at least part of the interface and sensing inputs, and a second sensor electrode may be configured for input sensing only. For example, the second sensor electrode may be disposed between substrates of the display device or may be external to the display device.

In some aspects, the display screen may be controlled or operated, at least in part, by the processing system 110. The processing system 110 may be configured to execute instructions related to sensing inputs and displaying the interface. For example, the processing system 110 may drive a display electrode to display at least a portion of the interface and sense user inputs, concurrently. In another example, the processing system 110 may drive a first display electrode to display at least a portion of the interface while concurrently driving a second display electrode to sense user inputs.

As described above, the processing system 110 may detect a force or pressure exerted by the input object 140 in the sensing region 120 (e.g., an "input force") based on changes in the resistive properties of a corresponding force sensor (such as a force sensing resistor or "FSR"). However, the processing system 110 may detect or measure the resistance of an FSR only when a sufficient (e.g., threshold) amount of force is exerted on the input surface to cause the conductors to come into contact with the underlying resistive substrate. In its quiescent state, the FSR effectively operates as an open circuit (e.g., with infinite resistance between the conductors). Thus, the processing system 110 may be unable to perform force sensing via the FSR in response to light taps and/or touches on the input surface.

Aspects of the present disclosure provide a method and apparatus for selectively operating a sensor apparatus (such as an FSR) in a capacitive sensing mode or a resistive sensing mode. When operating in the capacitive sensing mode, the sensor apparatus may be configured to detect user inputs in the sensing region 120 using capacitive sensing techniques. For example, such user inputs may correspond to a presence of an input object 140 in a proximity of the sensing region 120. When operating in the resistive sensing mode, the sensor apparatus may be configured to detect user inputs in the sensing region 120 using resistive sensing techniques. For example, such user inputs may correspond to a force exerted by an input object 140 in the sensing region 120.

In some embodiments, the processing system 110 may be configured to switch between the operating modes based, at least in part, on an amount of force exerted on the input surface. More specifically, the processing system 110 may operate the sensor apparatus in the capacitive sensing mode when little or no external forces are exerted on the input surface (or the forces exerted are below a threshold level). For example, the sensor apparatus may be configured for capacitive sensing in its "default" or quiescent state. When a threshold amount of force or pressure is exerted on the input surface, the processing system 110 may operate the sensor apparatus in the resistive sensing mode. Thus, the pressure applied on the input surface may function as a trigger for transitioning the operating mode of the sensor apparatus between the capacitive sensing mode and the resistive sensing mode.

In other embodiments, the processing system 110 may periodically switch between the operating modes. For example, the processing system 110 may operate the sensor apparatus in the capacitive sensing mode for a first interval of time. When the first interval of time expires, the processing system 110 may switch operating modes, and operate the sensor apparatus in the resistive sensing mode for a second interval of time. Thus, the processing system 110 may periodically switch back and forth between the capacitive sensing mode and the resistive sensing mode (e.g., in staggered intervals). In some embodiments, the frequency of the mode switching may be configured to ensure that proximity-based user inputs and force-based user inputs can be properly detected by the processing system 110 when an input object is in contact with (or proximity to) the sensing region 120.

Among other advantages, the embodiments described herein enable FSRs to be used for detecting user inputs caused by input objects in a proximity of the sensing region 120 (including light taps and/or touches on the input surface) as well as forces exerted by input objects in the sensing region 120. More specifically, aspects of the present disclosure may leverage the circuitry of existing FSRs to perform capacitive sensing (e.g., when the FSR is in a quiescent state) and resistive sensing (e.g., when a threshold amount of force or pressure is applied to the FSR). This allows the input device 100 to detect a continuum of user inputs including, for example, an input object 140 entering a threshold proximity of the sensing region 120, the input object 140 making initial contact with the sensing region 120, and a force exerted in the sensing region 120 as the input object 140 is pressed against the input surface.

Figure 2:
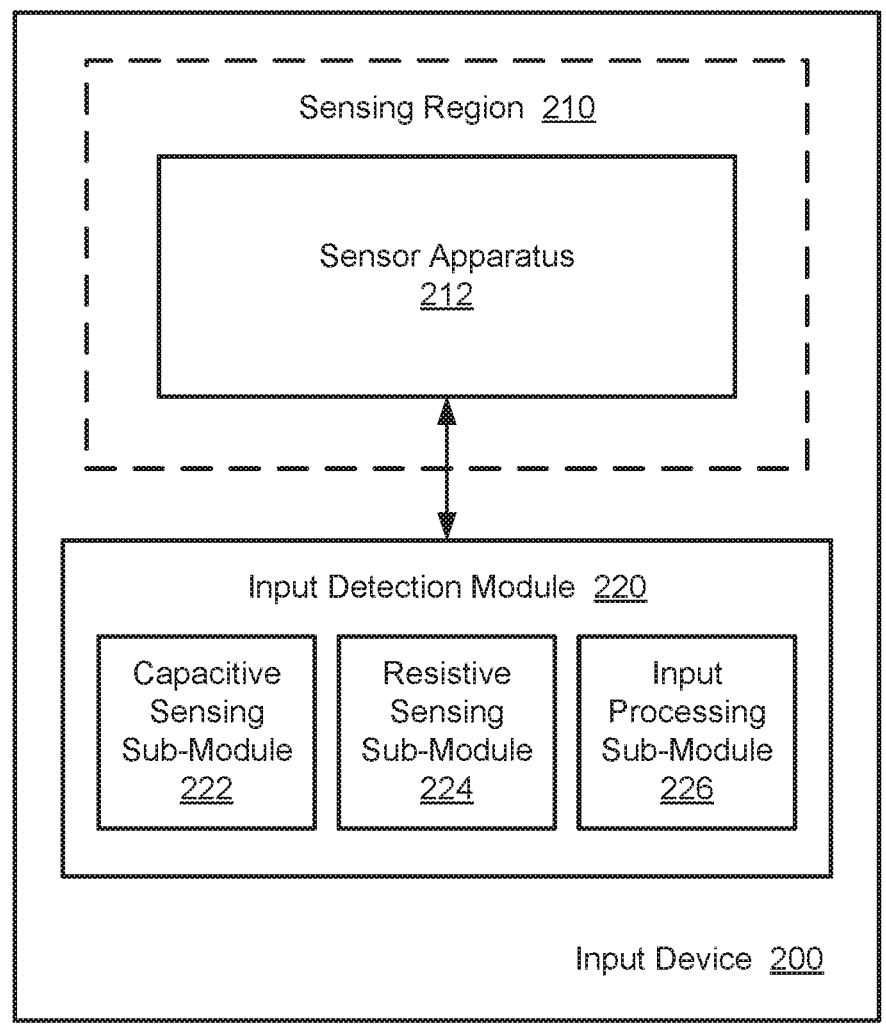
FIG. 2 shows a block diagram of an input device capable of selectively operating a sensor apparatus in a capacitive sensing mode and a resistive sensing mode, in accordance with some embodiments.

FIG. 2 shows a block diagram of an input device 200 capable of selectively operating a sensor apparatus in a capacitive sensing mode and a resistive sensing mode, in accordance with some embodiments. The input device 200 includes a sensing region 210 and an input detection module 220. The sensing region 210 may encompass any space above, around, in, and/or proximate to the input device 200 in which the input device 200 is able to detect user input, such as provided by one or more input objects (not shown for simplicity). The size, shape, and/or location of the sensing region 210 may vary depending on actual implementations.

In some embodiments, the sensing region 210 includes, or is otherwise coupled to, a sensor apparatus 212. The sensor apparatus 212 may include circuitry for detecting inputs in the sensing region 210 using capacitive sensing technologies and force sensing technologies (such as described above with respect to FIG. 1). In some aspects, the sensor apparatus 212 may be a force sensing resistor (FSR). For example, the sensor apparatus 212 may comprise an active layer, including a number of conductive electrodes, and a resistive layer formed from a resistive substrate. The active layer and resistive layer are separated by an air gap, such that the electrodes are not in contact with the resistive substrate when the sensor apparatus 212 is in a quiescent state (e.g., little or no external force or pressure is exerted on the sensor apparatus 212). The active layer may be brought into contact with the resistive layer (e.g., by closing the air gap) when a threshold amount of force is applied to the sensor apparatus 212, causing the electrodes to make contact with the resistive substrate.

The sensor apparatus 212 is further coupled to the input detection module 220. The input detection module 220 may be implemented by, or include at least a portion of, a processing system (such as processing system 110) that controls an operation of the sensor apparatus 212. In some embodiments, the input detection module 220 may periodically switch between operating the sensor apparatus 212 in a capacitive sensing mode and operating the sensor apparatus 212 in a resistive sensing mode (e.g., for predetermined intervals). In other embodiments, the input detection module 220 may dynamically operate the sensor apparatus 212 in a capacitive sensing mode or a resistive sensing mode based, at least in part, on sensor information received from the sensor apparatus 212. More specifically, the input detection module 220 may switch between the operating modes based on an amount of force exerted on the sensing region 210 (or the sensor apparatus 212). In some aspects, the input detection module 220 may include a capacitive sensing sub-module 222, a resistive sensing sub-module 224, and an input processing sub-module 226.

The capacitive sensing sub-module 222 may detect or measure a capacitance of the sensor apparatus 212 when the sensor apparatus 212 is configured to operate in the capacitive sensing mode. For example, the capacitive sensing sub-module 222 may measure a capacitive coupling between two electrically isolated electrodes in the active layer of the sensor apparatus 212. In some embodiments, the capacitive sensing sub-module 222 may be enabled or activated by default (e.g., when the sensor apparatus 212 is in a quiescent state), and may be disabled or deactivated when the capacitance exceeds (or drops below) a threshold level. As described in greater detail below, the capacitance of the sensor apparatus 212 may exceed the threshold level when a sufficient amount of force is applied to the sensing region 210 (e.g., to cause the active layer to come into contact with the underlying resistive layer).

The resistive sensing sub-module 224 may detect or measure a resistance of the sensor apparatus 212 when the sensor apparatus 212 is configured to operate in the resistive sensing mode. For example, the resistive sensing sub-module 224 may measure a resistive coupling between two electrodes that are in contact with the resistive layer of the sensor apparatus 212. In some embodiments, the resistive sensing sub-module 224 may be enabled or activated when the capacitance of the sensor apparatus 212 (e.g., as measured by the capacitive sensing sub-module 222) exceeds a threshold level, and may be disabled or deactivated when the resistance exceeds (or drops below) a threshold level. As described in greater detail below, the resistance of the sensor apparatus 212 may exceed the threshold level when little or no external forces are exerted on the sensing region 210 (e.g., such that the active layer is not in contact with the underlying resistive layer).

The input processing sub-module 226 may process user inputs based at least in part on sensor information received via the sensor apparatus 212. In some embodiments, the input processing sub-module 226 may process user inputs based at least in part on capacitive sensing information (e.g., corresponding to a measured capacitance of the sensor apparatus 212) generated by the capacitive sensing sub-module 222. For example, the input processing sub-module 226 may correlate the capacitive sensing information with a presence and/or location of an input object in proximity of the sensing region 210. In other embodiments, the input processing sub-module 226 may process user inputs based at least in part on resistive sensing information (e.g., corresponding to a measured resistance of the sensor apparatus 212) generated by the resistive sensing sub-module 224. For example, the input processing sub-module 226 may correlate the resistive sensing information with an amount of force or pressure exerted by an input object on the sensing region 210.

Figure 3:
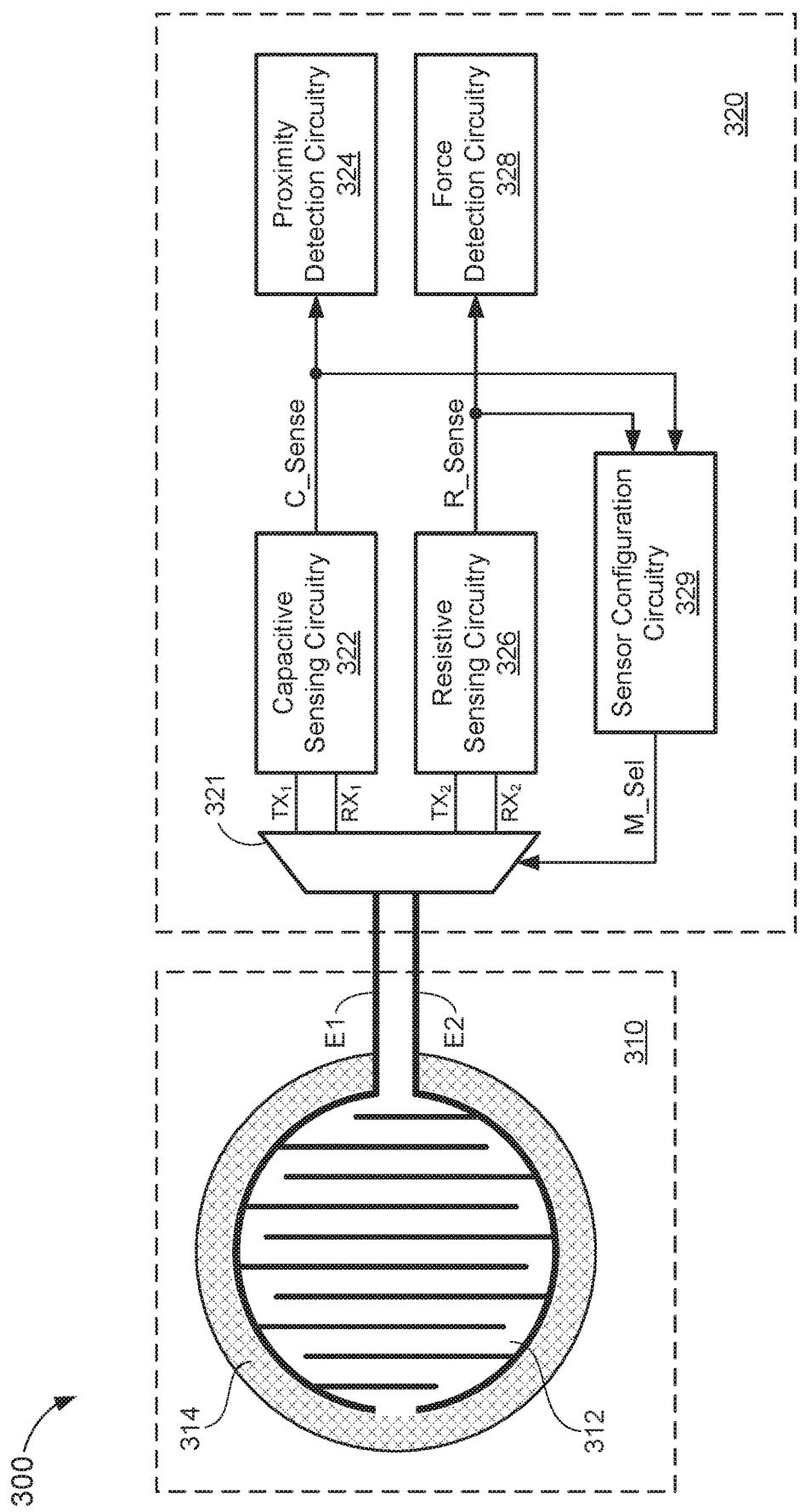
FIG. 3 shows an example sensor configuration that is operable in a capacitive sensing mode and a resistive sensing mode, in accordance with some embodiments.

FIG. 3 shows an example sensor configuration 300 that is operable in a capacitive sensing mode and a resistive sensing mode, in accordance with some embodiments. The sensor configuration 300 includes a sensor apparatus 310 coupled to processing circuitry 320. In some embodiments, the processing circuitry 320 may selectively operate the sensor apparatus 310 in a capacitive sensing mode or a resistive sensing mode. For example, when operating in the capacitive sensing mode, the processing circuitry 320 may detect a presence and/or location of input objects in proximity of the sensor apparatus 310 (e.g., including light taps and/or touches on an input surface associated with the sensor apparatus 310) based at least in part on a capacitance of the sensor apparatus 310. When operating in the resistive sensing mode, the processing circuitry 320 may detect forces exerted by input objects pressing on the sensor apparatus 310.

In some embodiments, the sensor apparatus 310 may correspond to a force sensing resistor (FSR). For example, the sensor apparatus 310 may comprise an active layer 312 and an underlying resistive layer 314. The active layer 312 may be separated from the underlying resistive layer 314 by an air gap (not shown for simplicity) when the sensor apparatus 310 is in a quiescent state. The active layer 312 includes a number of conductive electrodes E1 and E2 that are insulated (or electrically isolated) from one another while the sensor apparatus is in the quiescent state. The resistive layer 314 may be formed by a resistive substrate that may ohmically couple the conductive electrodes E1 and E2 to one another when the active layer 312 is brought into contact with the resistive layer 314 (e.g., when a threshold force or pressure is applied to the sensor apparatus 310).

The processing circuitry includes capacitive sensing circuitry 322, proximity detection circuitry 324, resistive sensing circuitry 326, force detection circuitry 328, and sensor configuration circuitry 329. In some embodiments, the sensor apparatus 310 may be coupled to the processing circuitry 320 via switching circuitry 321. More specifically, the switching circuitry 321 may selectively couple the electrodes E1 and E2 of the sensor apparatus 310 to the capacitive sensing circuitry 322 or the resistive sensing circuitry 326 based on a mode select (M_Sel) signal. In the example of FIG. 3, the switching circuitry 321 is depicted as a multiplexer (MUX). However, in actual implementations, the switching circuitry 321 may be implemented by any circuitry capable of performing similar switching functions. Still further, in some embodiments, the sensor apparatus 310 may be switchably coupled to the capacitive sensing circuitry 322 and the resistive sensing circuitry 326 without the switching circuitry 321 (e.g., as described in greater detail below).

The capacitive sensing circuitry 322 may include circuitry to detect or measure a capacitance of the sensor apparatus 310. For example, when operating in the capacitive sensing mode, the switching circuitry 321 may couple the electrodes E1 and E2 of the sensor apparatus 310 to transmit ($TX_1$) and receive ($RX_1$) terminals, respectively, of the capacitive sensing circuitry 322. It is noted that the electrodes E1 and E2 are electrically isolated from one another, and may thus function as a capacitor, as long as the active layer 312 is not in contact with the resistive layer 314. In some embodiments, the capacitive sensing circuitry 322 may transmit a signal (e.g., via the $TX_1$ terminal) to the first electrode E1 and receive a resulting signal, based on the transmitted signal, from the second electrode E2 (e.g., via the $RX_1$ terminal). The capacitive sensing circuitry 322 may generate capacitive sensing (C_Sense) information (e.g., corresponding to a measured capacitance between the electrodes E1 and E2) based, at least in part, on the resulting signal. In some aspects, the capacitive sensing information may be provided to the proximity detection circuitry 324.

The proximity detection circuitry 324 may process user inputs based on the capacitive sensing information. For example, the proximity detection circuitry 324 may compare the capacitive sensing information received from the capacitive sensing circuitry 322 with a baseline capacitance for the electrodes E1 and E2 to detect a presence and/or location of an input object in a proximity of the sensor apparatus 310. More specifically, an input object in contact and/or close proximity with the sensor apparatus 310 may cause a change in the capacitance of the electrodes E1 and E2 (e.g., relative to the corresponding baseline capacitance). Thus, the proximity detection circuitry 324 may correlate the detected change in capacitance with a particular type of user input (such as a touch, tap, or gesture input).

The resistive sensing circuitry 326 may include circuitry to detect or measure a resistance of the sensor apparatus 310. For example, when operating in the resistive sensing mode, the switching circuitry 321 may couple the electrodes E1 and E2 of the sensor apparatus 310 to transmit ($TX_2$) and receive ($RX_2$) terminals, respectively, of the resistive sensing circuitry 326. It is noted that the electrodes E1 and E2 are ohmically coupled to one another, via the resistive layer 314, when the active layer 312 is in contact with the resistive layer 314. In some embodiments, the resistive sensing circuitry 326 may couple the first electrode E1 to a voltage source (e.g., via the $TX_2$ terminal), and may couple the second electrode E2 to a resistor. The resistor may have a predetermined resistance which may be used to measure a resistance between the electrodes E1 and E2. For example, the resistive sensing circuitry 326 may generate resistive sensing (R_Sense) information (e.g., corresponding to a measured resistance between the electrodes E1 and E2) based, at least in part, on a voltage across the resistor. In some aspects, the resistive sensing information may be provided to the force detection circuitry 328.

The force detection circuitry 328 may process user inputs based on the resistive sensing information. For example, the force detection circuitry 328 may determine an amount of force or pressure exerted by an input object on the sensor apparatus 310 based on the resistive sensing information. More specifically, an input object pressing on an input surface of the sensor apparatus 310 may cause the active layer 312 to come into contact with the resistive layer 314. The resistance between the electrodes E1 and E2 decreases as the contact between the active layer 312 and the resistive layer 314 increases. Thus, an input object pressing on an input surface of the sensor apparatus 310 may cause a change in the resistance between the electrodes E1 and E2 (e.g., inversely related to the amount of force or pressure exerted on the sensor apparatus 310). Thus, the force detection circuitry 328 may correlate the detected change in resistance with a particular type of user input (such as a force or pressure input).

The sensor configuration circuitry 329 may control an operating mode of the sensor apparatus 310. In some embodiments, the sensor configuration circuitry 329 may periodically switch between operating the sensor apparatus 310 in the capacitive sensing mode and operating the sensor apparatus 310 in the resistive sensing mode. For example, the sensor configuration circuitry 329 may assert the M_Sel signal for a predetermined duration then de-assert the M_Sel signal for another predetermined duration (e.g., in a cyclical or repeating pattern). In some aspects, the frequency of the M_Sel signal may be configured to ensure that proximity-based user inputs and force-based user inputs can be properly detected by the proximity detection circuitry 324 and the force detection circuitry 328, respectively, when an input object is in contact with (or proximity to) the sensor apparatus 310.

In some other embodiments, the sensor configuration circuitry 329 may selectively operate the sensor apparatus 310 in the capacitive sensing mode or the resistive sensing mode based on an amount of force or pressure exerted on the sensor apparatus 310. For example, the sensor configuration circuitry 329 may generate the M_Sel signal based on sensor information received from the capacitive sensing circuitry 322 (e.g., C_Sense information) and/or the resistive sensing circuitry 326 (e.g., R_Sense information). As described above, the electrodes E1 and E2 may form an open circuit when the sensor apparatus 310 is in a quiescent state (such that the active layer 312 is not in contact with the resistive layer 314), and may form a closed circuit when a threshold amount of force or pressure is exerted on the sensor apparatus 310 (such that the active layer 312 is in contact with the resistive layer 314). Accordingly, the capacitive sensing information measured across the electrodes E1 and E2 may spike when the active layer 312 makes contact with the resistive layer 314. On the other hand, the resistive sensing information measured between the electrodes E1 and E2 may reach a maximum (e.g., infinite) value when the active layer 312 loses contact with the resistive layer 314.

In some embodiments, the sensor configuration circuitry 329 may switch the operating mode of the sensor apparatus 310 from the capacitive sensing mode to the resistive sensing mode upon detecting a spike in the capacitance of the sensor apparatus 310. For example, the sensor configuration circuitry 329 may assert the M_Sel signal when the capacitive sensing information measured across the electrodes E1 and E2 exceeds a threshold capacitance (e.g., as indicated by the C_Sense information). In some aspects, assertion of the M_Sel signal may cause the switching circuitry 321 to couple the electrodes E1 and E2 to the resistive sensing circuitry 326. In some other embodiments, the sensor configuration circuitry 329 may switch the operating mode of the sensor apparatus 310 from the resistive sensing mode to the capacitive sensing mode upon detecting that the resistance of the sensor apparatus 310 has reached a maximum value. For example, the sensor configuration circuitry 329 may de-assert the M_Sel signal when the resistive sensing information measured between the electrodes E1 and E2 exceeds a threshold resistance (e.g., as indicated by the R_Sense information). In some aspects, de-assertion of the M_Sel signal may cause the switching circuitry 321 to couple the electrodes E1 and E2 to the capacitive sensing circuitry 322.

By monitoring the capacitance and/or resistance of the sensor apparatus 310, the sensor configuration circuitry 329 may dynamically change the operating mode of the sensor apparatus 310 based on an amount of force or pressure exerted on the sensor apparatus 310. For example, the sensor configuration circuitry 329 may configure the sensor apparatus 310 to operate in the capacitive sensing mode (e.g., by de-asserting the M_Sel signal) when the sensor apparatus 310 is in a quiescent state (e.g., as indicated by the R_Sense information and/or C_Sense information), and may configure the sensor apparatus 310 to operate in the resistive sensing mode (e.g., by asserting the M_Sel signal) when a threshold amount of force or pressure is exerted on the sensor apparatus 310 (e.g., as indicated by the C_Sense and/or R_Sense information).

Figure 4A:
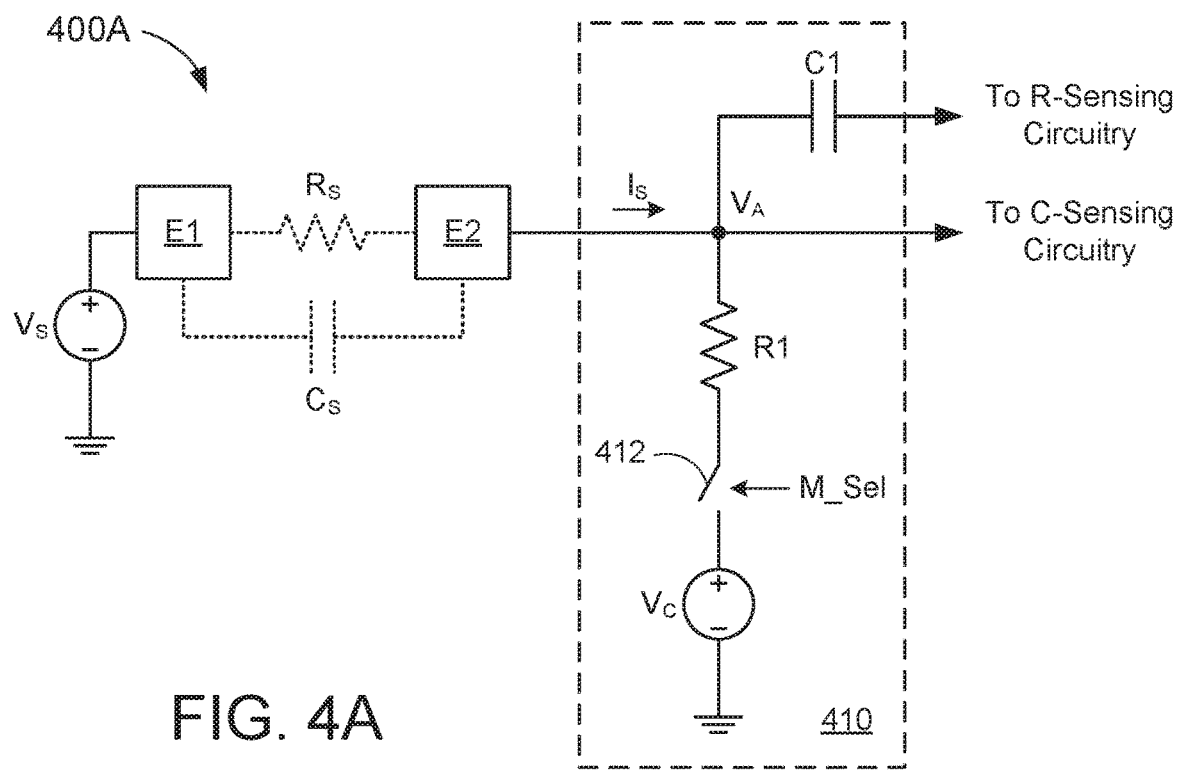
FIGS. 4A and 4B show circuit diagrams depicting example interfaces for coupling a sensor apparatus to capacitive sensing circuitry and resistive sensing circuitry of an input device, in accordance with some embodiments.

FIG. 4A shows a circuit diagram 400A depicting an example interface 410 for coupling a sensor apparatus to capacitive sensing circuitry and resistive sensing circuitry of an input device, in accordance with some embodiments. The interface 410 may be implemented, at least in part, by the switching circuitry 321 of FIG. 3. The interface 410 is coupled to an electrode (E2) of the sensor apparatus, and another electrode (E1) is coupled to a first voltage source ($V_S$). For example, the electrodes E1 and E2 may correspond to electrodes E1 and E2 of the sensor apparatus 310 of FIG. 3. Thus, in some embodiments, the electrodes E1 and E2 may comprise at least part of an active layer of an FSR.

The interface 410 is configured to couple the sensor apparatus (specifically the second electrode E2) to resistive sensing (R-sensing) circuitry and capacitive sensing (C-sensing) circuitry. In some embodiments, the resistive sensing circuitry may be coupled to the electrode E2 via a capacitor (C1) while the capacitive sensing circuitry may be coupled directly to the electrode E2. The interface 410 may include a resistor (R1) having a first end coupled to the electrode E2 and a second end selectively coupled to a second voltage source ($V_C$) via a switch 412. In some embodiments, the second voltage source $V_C$ may be complementary to the first voltage source $V_S$ (e.g., the voltage sources $V_S$ and $V_C$ may create a differential voltage across the electrodes E1 and E2). In other embodiments, the second voltage source $V_C$ may correspond to a ground potential (e.g., 0V). The resistor R1 may have a fixed and/or predetermined resistance that may provide a point of reference for measuring the resistance ($R_S$) between the electrodes E1 and E2 in the resistive sensing mode. For example, the resistor R1 in series with the electrodes E1 and E2 (e.g., $R_S$) may function as a voltage divider between the first voltage source $V_S$ and the second voltage source $V_C$. However, when operating in a capacitive sensing mode, it may be undesirable to have a path for current to flow away from the input of the capacitive sensing circuitry. Thus, in some embodiments, the switch 412 may be controlled by the M_Sel signal (e.g., based on the operating mode of the sensor apparatus).

When operating in the resistive sensing mode (e.g., the M_Sel signal is asserted), the switch 412 is closed and the second end of the resistor R1 is coupled to the second voltage source $V_C$. The electrodes E1 and E2 are ohmically coupled via a resistive layer (not shown for simplicity) of the sensor apparatus. The resistance $R_S$ between the electrodes E1 and E2 causes a voltage drop between the first voltage source $V_S$ and the first end of the resistor R1. The capacitor C1 allows the resistive sensing circuitry (e.g., resistive sensing circuitry 326 of FIG. 3) to measure the voltage ($V_A$) at the second electrode E2. More specifically, because the resistor R1 has a fixed resistance, any variations in the voltage $V_A$ may be attributed to changes in the resistance $R_S$ between the electrodes E1 and E2 (e.g., corresponding to the amount of force exerted on the sensor apparatus). Thus, the resistive sensing circuitry may determine the resistance $R_S$ of the sensor apparatus based on the voltage $V_A$ at the second electrode E2 (e.g., at the first end of the resistor R1).

When operating in the capacitive sensing mode (e.g., the M_Sel signal is de-asserted), the switch 412 is open and the second end of the resistor R1 is decoupled from the second voltage source $V_C$ (and/or is coupled to a floating voltage). The electrodes E1 and E2 may be capacitively coupled due to the lack of contact with the resistive layer of the sensor apparatus. The capacitance ($C_S$) between the electrodes E1 and E2 produces a unique current response when an alternating voltage is applied across the electrodes. For example, because current can no longer flow through the path of resistor R1, the capacitive sensing circuitry (e.g., capacitive sensing circuitry 322 of FIG. 3) may control and/or vary the voltage $V_A$ at the second electrode E2 to produce an alternating current ($I_S$) between the electrodes E1 and E2. The capacitive sensing circuitry may then determine the capacitance $C_S$ of the sensor apparatus based on the current Is exiting the second electrode E2.

In the example of FIG. 4A, the output path to the resistive sensing circuitry includes a capacitor C1, whereas the output path to the capacitive sensing circuitry does not. It is noted that, while the capacitor C1 may enable the resistive sensing circuitry to detect the resistance $R_S$ between the electrodes E1 and E2 (e.g., by measuring the voltage $V_A$), the presence of such a capacitor along the output path to the capacitive sensing circuitry may affect the capacitance $C_S$ across the electrodes E1 and E2. For example, the resulting current Is would reflect the combined capacitances of $C_S$ and C1, reducing the overall sensitivity of the capacitive sensing circuitry. However, the effects of the capacitor C1 may be mitigated if the capacitance of C1 is greater than the capacitance $C_S$. Thus, in some embodiments, the resistive sensing circuitry and the capacitive sensing circuitry may share the same output path of the interface 410 (e.g., which includes the capacitor C1) if the capacitance of C1 exceeds a threshold capacitance level (e.g., $\geq C_S$).

Figure 4B:
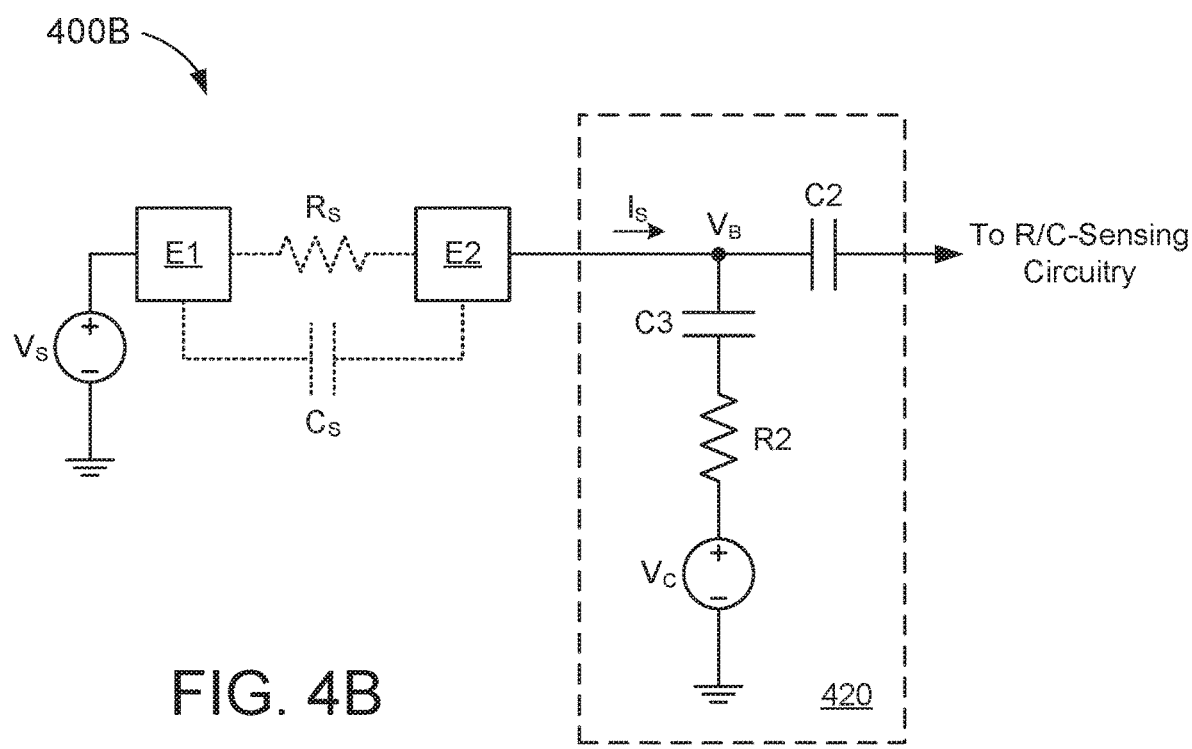

FIG. 4B shows a circuit diagram 400B depicting an example interface 420 for coupling a sensor apparatus to capacitive sensing circuitry and resistive sensing circuitry of an input device, in accordance with some other embodiments. The interface 420 may be implemented, at least in part, by the switching circuitry 321 of FIG. 3. The interface 420 is coupled to the second electrode E2 of the sensor apparatus, and the first electrode E1 is coupled to the first voltage source $V_S$. As described above, the electrodes E1 and E2 may comprise at least part of an active layer of an FSR (such as the sensor apparatus 310 of FIG. 3).

The interface 420 is configured to couple the sensor apparatus (specifically the second electrode E2) to resistive sensing circuitry and capacitive sensing circuitry. In some embodiments, the resistive sensing circuitry and the capacitive sensing circuitry may be coupled to the electrode E2 via a capacitor (C2). For example, the capacitance of C2 may be greater than a maximum capacitance $C_S$ that can be measured between the electrodes E1 and E2 (such as described above with respect to FIG. 4A). The interface 420 may include a resistor (R2) having a first end coupled to the electrode E2 via a capacitor (C3) and a second end coupled to a second voltage source ($V_C$). As described above, the second voltage source $V_C$ may be complementary to the first voltage source $V_S$ (e.g., to create a differential voltage across the electrodes E1 and E2), or may correspond to a ground potential (e.g., 0V). It is noted that, in contrast with the resistor R1 of FIG. 4A, the second end of resistor R2 may be permanently coupled to the second voltage source $V_C$. More specifically, when operating in the resistive sensing mode, the capacitor C3 in series with the resistor R2 provide a fixed point of reference for measuring the resistance $R_S$ between the electrodes E1 and E2. On other hand, when operating in the capacitive sensing mode, the capacitor C3 may present itself as a background capacitance through the resistor R2. Thus, as long as the capacitance of C3 is smaller than a threshold capacitance, the presence of the capacitor C3 (and the resistor R2 coupled to the second voltage source $V_C$) should not affect the ability of the capacitive sensing circuitry to measure the capacitance $C_S$ between the electrodes E1 and E2.

When operating in the resistive sensing mode, the electrodes E1 and E2 are ohmically coupled via resistive layer (not shown for simplicity) of the sensor apparatus. The resistance $R_S$ between the electrodes E1 and E2 causes a voltage drop between the voltage source $V_S$ and the capacitor C3. The capacitor C2 allows the resistive sensing circuitry (e.g., resistive sensing circuitry 326 of FIG. 3) to measure the voltage ($V_B$) at the second electrode E2. More specifically, because the capacitor C3 and resistor R2 provide a fixed impedance, any variations in the voltage $V_B$ may be attributed to changes in the resistance $R_S$ between the electrodes E1 and E2 (e.g., corresponding to the amount of force exerted on the sensor apparatus). Thus, the resistive sensing circuitry may determine the resistance $R_S$ of the sensor apparatus based on the voltage $V_B$ at the second electrode E2 (e.g., at the capacitor C3).

When operating in the capacitive sensing mode, the electrodes E1 and E2 may be capacitively coupled due to the lack of contact with the resistive layer of the sensor apparatus. The capacitance $C_S$ between the electrodes E1 and E2 produces a unique current response when an alternating voltage is applied across the electrodes. For example, since the capacitor C3 effectively decouples the resistor R2 from the path of current exiting the second electrode E2, the capacitive sensing circuitry (e.g., capacitive sensing circuitry 322 of FIG. 3) may control and/or vary the voltage $V_B$ at the second electrode E2 to produce an alternating current $I_S$ between the electrodes E1 and E2 (e.g., based on differences between the voltages $V_B$ and $V_S$). The capacitive sensing circuitry may then determine the capacitance $C_S$ of the sensor apparatus based on the current $I_S$ exiting the second electrode E2.

In the example of FIG. 4B, the resistive sensing circuitry and capacitive sensing circuitry may be coupled to the same output path of the interface 420 (e.g., which includes the capacitor C2). However, in other embodiments, the interface 420 may provide separate output paths for the resistive sensing circuitry and the capacitive sensing circuitry (e.g., as described above with respect to FIG. 4A). For example, the resistive sensing circuitry may be coupled to the electrode E2 via the capacitor C2, while the capacitive sensing circuitry may be coupled directly to the electrode E2.

Figure 5:
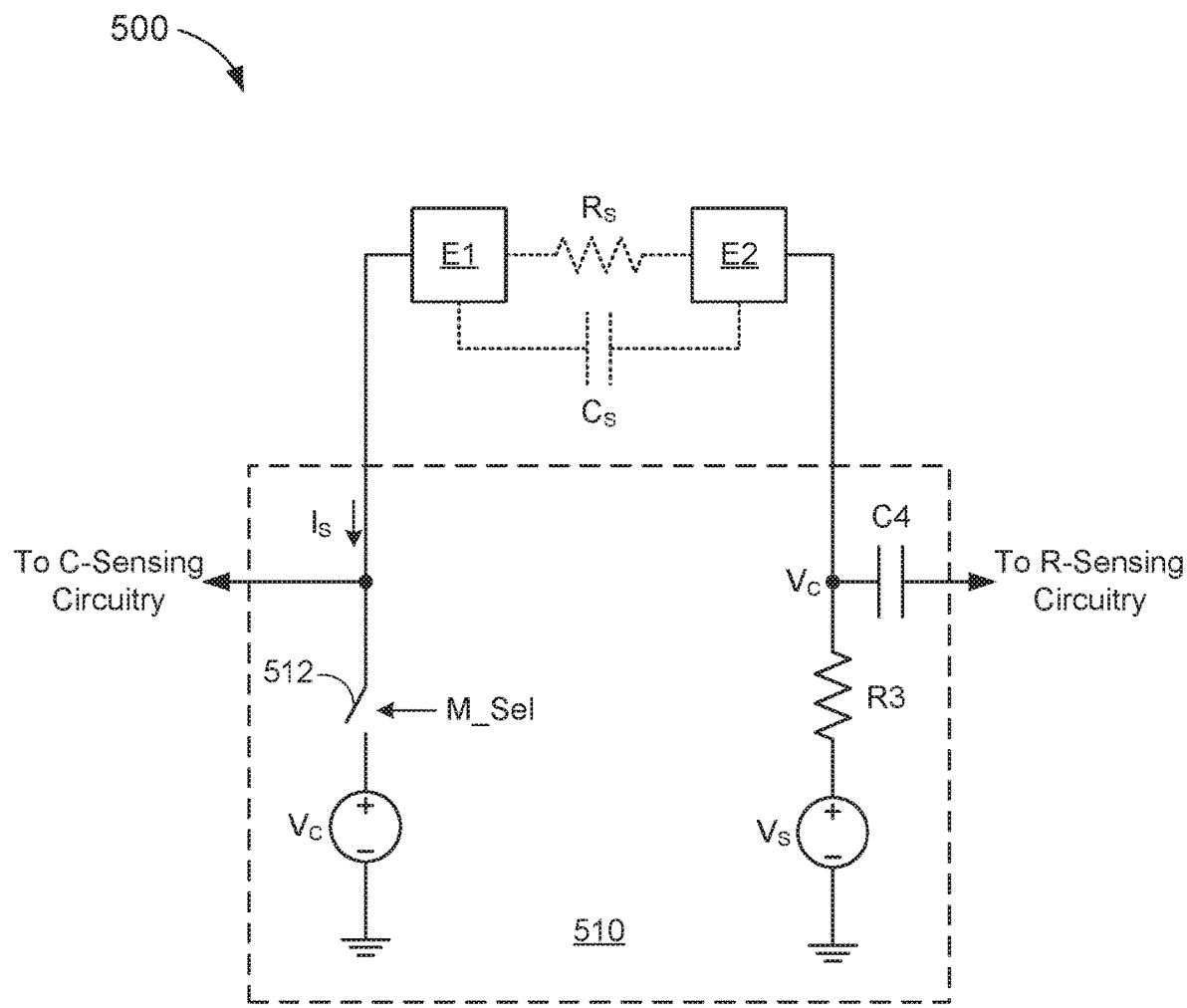
FIG. 5 shows a circuit diagram depicting an example interface for coupling a sensor apparatus to capacitive sensing circuitry and resistive sensing circuitry of an input device, in accordance with some other embodiments.

FIG. 5 shows a circuit diagram 500 depicting an example interface 510 for coupling a sensor apparatus to capacitive sensing circuitry and resistive sensing circuitry of an input device, in accordance with some other embodiments. The interface 510 may be implemented, at least in part, by the switching circuitry 321 of FIG. 3. The interface 510 is coupled to electrodes E1 and E2, which may comprise at least part of an active layer of an FSR (such as the sensor apparatus 310 of FIG. 3).

The interface 510 is configured to couple the sensor apparatus to resistive sensing (R-sensing) circuitry and capacitive sensing (C-sensing) circuitry. In some embodiments, the resistive sensing circuitry may be coupled to the electrode E2 via a capacitor (C4) while the capacitive sensing circuitry may be coupled directly to the electrode E1. The interface 510 may include a resistor (R3) having a first end coupled to the electrode E2 and a second end coupled to a first voltage source ($V_S$). The electrode E1 may be selectively coupled to a second voltage source ($V_C$) via a switch 512. In some embodiments, the switch 512 may be controlled by the M_Sel signal (e.g., based on the operating mode of the sensor apparatus). The resistor R3 may have a fixed and/or predetermined resistance that may provide a point of reference for measuring the resistance ($R_S$) between the electrodes E1 and E2 in the resistive sensing mode. For example, the resistor R3 in series with the electrodes E1 and E2 (e.g., $R_S$) may function as a voltage divider between the first voltage source $V_S$ and the second voltage source $V_C$.

When operating in the resistive sensing mode (e.g., the M_Sel signal is asserted), the switch 512 is closed and electrode E1 is coupled to second voltage source $V_C$. The electrodes E1 and E2 are ohmically coupled via a resistive layer (not shown for simplicity) of the sensor apparatus. The resistance $R_S$ between the electrodes E1 and E2 causes a voltage drop between the first voltage source $V_S$ and the first end of the resistor R3. The capacitor C4 allows the resistive sensing circuitry (e.g., resistive sensing circuitry 326 of FIG. 3) to measure the voltage ($V_C$) at the second electrode E2. Accordingly, the resistive sensing circuitry may determine the resistance $R_S$ of the sensor apparatus based on the voltage $V_C$ at the second electrode E2 (e.g., at the first end of the resistor R3).

When operating in the capacitive sensing mode (e.g., the M_Sel signal is de-asserted), the switch 512 is open and the electrode E1 is decoupled from the second voltage source $V_C$ (and/or is coupled to a floating voltage). The electrodes E1 and E2 may be capacitively coupled due to the lack of contact with the resistive layer of the sensor apparatus. In some embodiments, the capacitive sensing circuitry (e.g., capacitive sensing circuitry 322 of FIG. 3) may control and/or vary the voltage $V_C$ at the electrode E1 to produce an alternative current ($I_S$) between the electrodes E1 and E2. The capacitive sensing circuitry may then determine the capacitance ($C_S$) of the sensor apparatus based on the current $I_S$ exiting the first electrode E1.

Figure 6:
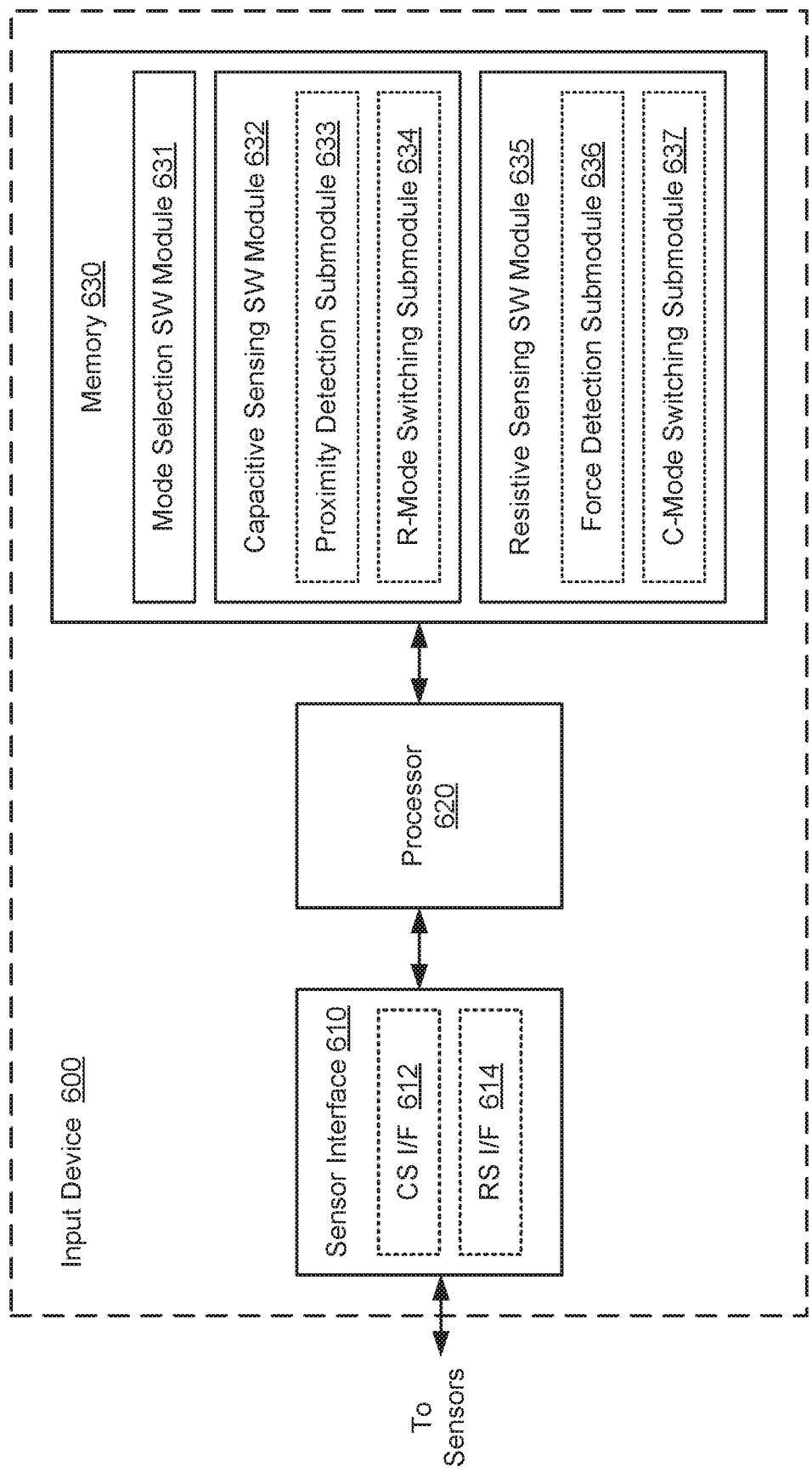
FIG. 6 shows a block diagram of an input device capable of operating a sensor apparatus in a capacitive sensing mode and a resistive sensing mode, in accordance with some other embodiments.

FIG. 6 shows a block diagram of an input device 600 capable of operating a sensor apparatus in a capacitive sensing mode and a resistive sensing mode, in accordance with some other embodiments. The input device 600 may be an embodiment of any of the input devices depicted in FIGS. 1-5. In some embodiments, the input device 600 may include a sensor interface 610, a processor 620, and a memory 630.

The sensor interface 610 may be coupled to a sensor apparatus that is operable in a capacitive sensing mode and a resistive sensing mode (such as the sensor apparatus 310 of FIG. 3). In some embodiments, the sensor apparatus may correspond to an FSR (not shown for simplicity). The sensor interface 610 may include a capacitive sensing interface (I/F) 612 and a resistive sensing interface 614. The capacitive sensing interface 612 may be used to communicate with the sensor apparatus when operating in the capacitive sensing mode. For example, the capacitive sensing interface 612 may transmit signals to a first electrode of the sensor apparatus and receive resulting signals from a second electrode of the sensor apparatus. The resistive sensing interface 614 may be used to communicate with the sensor apparatus when operating in the resistive sensing mode. For example, the resistive sensing interface 614 may couple the first electrode of the sensor apparatus to a voltage source and may couple the second electrode of the sensor apparatus to a grounded resistor.

The memory 630 may include a non-transitory computer-readable medium (e.g., one or more nonvolatile memory elements, such as EPROM, EEPROM, Flash memory, a hard drive, etc.) that may store at least the following software (SW) modules:

- a mode selection SW module 631 to select an operating mode for the sensor apparatus;
- a capacitive sensing SW module 632 to measure a capacitance of the sensor apparatus when operating in the capacitive sensing mode, the capacitive sensing SW module 632 including:
  - a proximity detection submodule 633 to detect a presence of an input object in proximity of the sensor apparatus based at least in part on the measured capacitance; and
  - a resistive mode (R-Mode) switching submodule 634 to change the operating mode of the sensor apparatus from the capacitive sensing mode to the resistive sensing mode;
- a resistive sensing SW module 635 to measure a resistance of the sensor apparatus when operating in the resistive sensing mode, the resistive sensing SW module 635 including:
  - a force detection submodule 636 to detect an amount of force or pressure exerted by the input object on the sensor apparatus based at least in part on the measured resistance; and
  - a capacitive mode (C-Mode) switching submodule 637 to change the operating mode of the sensor apparatus from the resistive sensing mode to the capacitive sensing mode.

Each software module includes instructions that, when executed by the processor 620, cause the input device 600 to perform the corresponding functions. The non-transitory computer-readable medium of memory 630 thus includes instructions for performing all or a portion of the operations described below with respect to FIG. 7.

Processor 620 may be any suitable one or more processors capable of executing scripts or instructions of one or more software programs stored in the input device 600 (e.g., within memory 630). For example, the processor 620 may execute the mode selection SW module 631 to select an operating mode for the sensor apparatus. The processor 620 may also execute the capacitive sensing SW module 632 to measure a capacitance of the sensor apparatus when operating the capacitive sensing mode. In executing the capacitive sensing SW module 632, the processor 620 may further execute the proximity detection submodule 633 and/or the resistive mode switching submodule 634. For example, the processor 620 may execute the proximity detection submodule 633 to detect a presence of an input object in proximity of the sensor apparatus based at least in part on the measured capacitance. The processor 620 may execute the resistive mode switching submodule 634 to change the operating mode of the sensor apparatus from the capacitive sensing mode to the resistive sensing mode.

Still further, the processor 620 may execute the resistive sensing SW module 635 to measure a resistance of the sensor apparatus when operating in the resistive sensing mode. In executing the resistive sensing SW module 635, the processor 620 may further execute the force detection submodule 636 and/or the capacitive mode switching submodule 637. For example, the processor 620 may execute the force detection submodule 636 to detect an amount of force or pressure exerted by the input object on the sensor apparatus based at least in part on the measure resistance. The processor 620 may execute the capacitive mode switching submodule 637 to change the operating mode of the sensor apparatus from the resistive sensing mode to the capacitive sensing mode.

Figure 7:
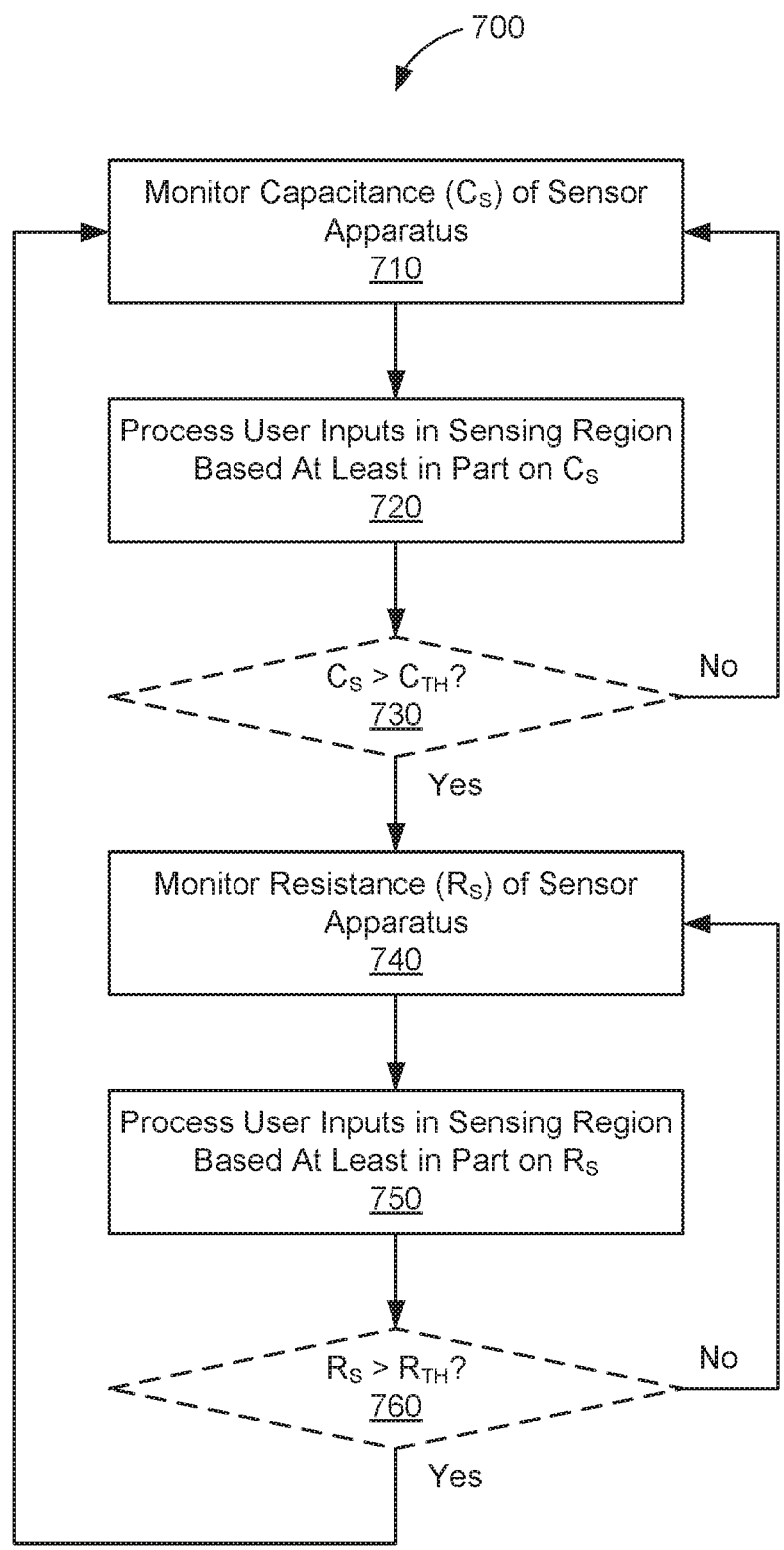
FIG. 7 shows an illustrative flowchart depicting an example operation for selectively operating a sensor apparatus in a capacitive sensing mode or a resistive sensing mode, in accordance with some embodiments.

FIG. 7 shows an illustrative flowchart depicting an example operation 700 for selectively operating a sensor apparatus in a capacitive sensing mode or a resistive sensing mode, in accordance with some embodiments. With reference for example to FIG. 2, the operation 700 may be performed by the input device 200 to detect user inputs in the sensing region 210 based, at least in part, on a capacitance or a resistance of the sensor apparatus 212. In some embodiments, the sensor apparatus 212 may be an FSR (e.g., including an active layer, with a number of conductive electrodes, and an underlying resistive layer formed from a resistive substrate).

In some embodiments, the sensor apparatus 212 may be configured to operate in the capacitive sensing mode when in a quiescent state. The input device 200 may monitor a capacitance ($C_S$) of the sensor apparatus 212 when operating in the capacitive sensing module (710). For example, the capacitive sensing sub-module 222 may measure a capacitive coupling between two electrically isolated electrodes in the active layer of the sensor apparatus 212 by transmitting a signal to a first electrode and receiving a resulting signal, based on the transmitted signal, from a second electrode. The capacitive sensing sub-module 222 may then measure the capacitance between the electrodes based, at least in part, on the resulting signal.

The input device 200 may process user inputs in the sensing region 210 based at least in part on the measured capacitance $C_S$ (720). For example, the input processing sub-module 226 may compare the measured capacitance $C_S$ with a baseline capacitance of the sensor apparatus 212 to detect a presence and/or location of an input object in proximity of the sensing region 210. More specifically, an input object in contact and/or close proximity with the sensing region 210 may cause a change in the capacitance of the electrodes (e.g., relative to the corresponding baseline capacitance). Thus, the input processing sub-module 226 may correlate the detected change in capacitance with a particular type of user input (such as a touch, tap, or gesture input).

In some embodiments, the input device 200 may determine whether the measured capacitance $C_S$ exceeds a threshold capacitance ($C_{TH}$) (730). For example, the threshold capacitance $C_{TH}$ may correspond with a spike in the capacitance of the sensor apparatus 212 that occurs when the active layer makes contact with the resistive layer. Thus, the threshold capacitance $C_{TH}$ may correspond to a threshold for triggering a transition from the capacitive sensing mode to the resistive sensing mode. As long as the capacitive sensing information indicates that the capacitance $C_S$ is below the threshold capacitance $C_{TH}$ (as tested at 730), the input device 200 may continue monitoring the capacitance $C_S$ of the sensor apparatus 212 (710).

If the measured capacitance $C_S$ exceeds the threshold capacitance $C_{TH}$ (as tested at 730), the input device 200 may begin monitoring a resistance ($R_S$) of the sensor apparatus 212 (740). In other embodiments, the input device 200 may switch to monitoring the resistance $R_S$ of the sensor apparatus 212 (at 740) once a threshold period has elapsed (e.g., irrespective of the capacitance $C_S$). For example, the resistive sensing sub-module 224 may measure a resistance between the electrodes in the active layer of the sensor apparatus 212 by coupling the first electrode to a voltage source and coupling the second electrode to a grounded resistor. The resistive sensing sub-module 224 may then measure the resistance between the electrodes based, at least in part, on a voltage drop across the grounded resistor.

The input device 200 may process user inputs in the sensing region 210 based at least in part on the measured resistance $R_S$ (750). For example, the resistance $R_S$ between the electrodes in the active layer of the sensor apparatus 212 increases as the amount of force or pressure applied to the sensing region 210 increases. More specifically, an input object pressing on the sensing region 210 may cause a change in the resistance of the sensor apparatus 212 that is inversely related to the amount of force or pressure exerted. Thus, the input processing sub-module 226 may correlate the detected change in resistance with a particular type of user input (such as a force or pressure input).

In some embodiments, the input device 200 may determine whether the measured resistance $R_S$ exceeds a threshold resistance ($R_{TH}$) (760). For example, the threshold resistance may represent a maximum (e.g., infinite) resistance of the sensor apparatus 212 that occurs when the active layer is not in contact with the resistive layer. Thus, the threshold resistance $R_{TH}$ may correspond to a threshold for triggering a transition from the resistive sensing mode to the capacitive sensing mode. As long as the resistive sensing information indicates that the resistance $R_S$ is below the threshold capacitance $R_{TH}$ (as tested at 730), the input device may continue monitoring the resistance $R_S$ of the sensor apparatus 212 (740). However, if the measured resistance $R_S$ exceeds the threshold resistance $R_{TH}$ (as tested at 730), the input device 200 may revert back to monitoring the capacitance $C_S$ of the sensor apparatus 212 (710). In other embodiments, the input device 200 may switch to monitoring the capacitance $C_S$ of the sensor apparatus 212 once a threshold period has elapsed (e.g., irrespective of the resistance $R_S$).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

In the foregoing specification, embodiments have been described with reference to specific examples thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An input device, comprising:
a sensor apparatus coupled to a sensing region of the input device; and
processing circuitry configured to operate the sensor apparatus in at least a first mode or a second mode, wherein the processing circuitry is further configured to:
detect a capacitance of the sensor apparatus when operating in the first mode;
detect a resistance of the sensor apparatus when operating in the second mode;
switch from the first mode to the second mode when the detected capacitance exceeds a threshold capacitance;
switch from the second mode to the first mode when the detected resistance exceeds a threshold resistance; and
process user inputs in the sensing region based at least in part on the detected capacitance or the detected resistance of the sensor apparatus.

2. The input device of claim 1, wherein the processing circuitry is further configured to:
operate the sensor apparatus in the first mode when no external forces are exerted in the sensing region; and
operate the sensor apparatus in the second mode when at least a threshold amount of force is applied to the sensing region.

3. The input device of claim 1, wherein the processing circuitry is configured to switch between the first mode and the second mode periodically.

4. The input device of claim 1, wherein the sensor apparatus comprises:
an active layer including a first conductive element and a second conductive element; and
a resistive layer formed from a conductive substrate, wherein an air gap separates the active layer from the resistive layer when no external forces are exerted on the sensor apparatus.

5. The input device of claim 4, wherein the processing circuitry is configured to detect the capacitance of the sensor apparatus by:
transmitting a first signal via the first conductive element;
receiving a resulting signal, based on the first signal, via the second conductive element; and
measuring a capacitance between the first conductive element and the second conductive element based at least in part on the resulting signal.

6. The input device of claim 4, wherein the processing circuitry is configured to detect the resistance of the sensor apparatus by:
coupling the first conductive element to a first voltage source;
coupling the second conductive element to a resistor, wherein a first end of the resistor is coupled to the second conductive element and a second end of the resistor is coupled to a second voltage source; and
measuring a resistance between the first conductive element and the second conductive element based at least in part on a voltage across the resistor.

7. The input device of claim 6, wherein the second voltage source corresponds to a ground potential.

8. The input device of claim 6, wherein the processing circuitry is further configured to:
couple the second end of the resistor to a floating voltage when operating the sensor apparatus in the first mode.

9. A method of operating an input device, comprising:
detecting a capacitance of a sensor apparatus when operating the sensor apparatus in a first mode;
detecting a resistance of the sensor apparatus when operating the sensor apparatus in a second mode;
switching from the first mode to the second mode when the detected capacitance exceeds a threshold capacitance;
switching from the second mode to the first mode when the detected resistance exceeds a threshold resistance; and
processing user inputs in a sensing region of the input device based at least in part on the detected capacitance or the detected resistance of the sensor apparatus, wherein the sensor apparatus is coupled to the sensing region.

10. The method of claim 9, further comprising:
operating the sensor apparatus in the first mode when no external forces are exerted in the sensing region; and
operating the sensor apparatus in the second mode when at least a threshold amount of force is applied to the sensing region.

11. The method of claim 9, further comprising:
switching between the first mode and the second mode periodically.

12. The method of claim 9, wherein the detecting of the capacitance comprises:
transmitting a first signal via a first conductive element of the sensor apparatus;

receiving a resulting signal, based on the first signal, via a second conductive element of the sensor apparatus; and measuring a capacitance between the first conductive element and the second conductive element based at least in part on the resulting signal.

13. The method of claim 9, wherein the detecting of the resistance comprises:

coupling a first conductive element to a first voltage source;

coupling a second conductive element to a resistor, wherein a first end of the resistor is coupled to the second conductive element and a second end of the resistor is coupled to a second voltage source; and measuring a resistance between the first conductive element and the second conductive element based at least in part on a voltage across the resistor.

14. The method of claim 13, wherein the second voltage source corresponds to a ground potential.

15. The method of claim 13, further comprising:

coupling the second end of the resistor to a floating voltage when operating the sensor apparatus in the first mode.

16. A non-transitory computer-readable medium storing instructions that, when executed by processing circuitry of an input device, cause the input device to perform operations comprising:

detecting a capacitance of a sensor apparatus when operating the sensor apparatus in a first mode, wherein the sensor apparatus is coupled to a sensing region of the input device;

detecting a resistance of the sensor apparatus when operating the sensor apparatus in a second mode;

switching from the first mode to the second mode when the detected capacitance exceeds a threshold capacitance;

switching from the second mode to the first mode when the detected resistance exceeds a threshold resistance; and processing user inputs in a sensing region of the input device based at least in part on the detected capacitance or the detected resistance of the sensor apparatus, wherein the sensor apparatus is coupled to the sensing region.

* * * * *